United States Patent
Han et al.

(10) Patent No.: US 9,203,606 B2
(45) Date of Patent: Dec. 1, 2015

(54) CLOCK RECOVERY CIRCUIT, DATA RECEIVING DEVICE, AND DATA SENDING AND RECEIVING SYSTEM

(71) Applicant: SILICON WORKS CO., LTD., Daejeon-si (KR)

(72) Inventors: Yun Tack Han, Anyang-si (KR); Kwang Il Oh, Daejeon (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 0 days.

(21) Appl. No.: 14/411,581

(22) PCT Filed: Jul. 5, 2013

(86) PCT No.: PCT/KR2013/005998
§ 371 (c)(1),
(2) Date: Dec. 29, 2014

(87) PCT Pub. No.: WO2014/007578
PCT Pub. Date: Jan. 9, 2014

(65) Prior Publication Data
US 2015/0163050 A1    Jun. 11, 2015

(30) Foreign Application Priority Data

Jul. 6, 2012  (KR) .......................... 10-2012-0073857

(51) Int. Cl.
*H04L 7/04* (2006.01)
*G09G 5/00* (2006.01)
*G09G 3/20* (2006.01)

(52) U.S. Cl.
CPC *H04L 7/04* (2013.01); *G09G 5/008* (2013.01); *G09G 3/2096* (2013.01); *G09G 2330/06* (2013.01); *G09G 2370/14* (2013.01)

(58) Field of Classification Search
CPC .......... H04L 7/033; H04L 7/04; G09G 5/008; G09G 2330/06; G09G 2370/14; G09G 3/2096
See application file for complete search history.

(56) References Cited

U.S. PATENT DOCUMENTS 6,680,874 B1 *  1/2004  Harrison ........................ 365/194
7,282,972 B2 *  10/2007  Lin ................................ 327/158
(Continued)

FOREIGN PATENT DOCUMENTS

KR    10-2007-0083318    8/2007
KR    10-2008-0066327    7/2008
(Continued)

OTHER PUBLICATIONS

Written Opinion of the International Searching Authority for International Application No. PCT/KR2013/005998, dated Nov. 4, 2013.
International Search Report for International Application No. PCT/KR2013/005998, dated Nov. 4, 2013.

*Primary Examiner* — Kenneth Lam
(74) *Attorney, Agent, or Firm* — Kile Park Reed & Houtteman PLLC

(57) ABSTRACT

A clock recovery circuit for recovering a clock signal from a clock-embedded data signal, a data receiving device for recovering a clock signal and a data signal from a clock-embedded data signal, and a data transmitting and receiving system for improving the protocol of a clock-embedded data signal. The data transmitting and receiving system includes a data transmitting device configured to transmit a clock-embedded data signal in which an embedded clock signal is embedded in a data signal; and a data receiving device configured to recover a clock signal corresponding to the embedded clock signal from the clock-embedded data signal.

9 Claims, 13 Drawing Sheets

(56) References Cited

U.S. PATENT DOCUMENTS

| | | | |
|---|---|---|---|
| 7,342,521 B1 * | 3/2008 | Liu | 341/100 |
| 2002/0186087 A1 * | 12/2002 | Kim et al. | 331/100 |
| 2003/0227989 A1 * | 12/2003 | Rhee et al. | 375/376 |
| 2008/0024180 A1 * | 1/2008 | Park et al. | 327/158 |
| 2008/0080649 A1 * | 4/2008 | Gibbons et al. | 375/355 |
| 2009/0189656 A1 * | 7/2009 | Huang | 327/158 |
| 2011/0286562 A1 * | 11/2011 | Jeon et al. | 375/371 |
| 2013/0197920 A1 * | 8/2013 | Lesso et al. | 704/500 |

FOREIGN PATENT DOCUMENTS

| | | |
|---|---|---|
| KR | 10-2010-0030303 | 3/2010 |
| KR | 10-2010-0043452 | 4/2010 |
| KR | 10-2011-0017275 | 2/2011 |
| KR | 10-2011-0132308 | 12/2011 |

* cited by examiner

CLOCK RECOVERY CIRCUIT, DATA RECEIVING DEVICE, AND DATA SENDING AND RECEIVING SYSTEM

TECHNICAL FIELD

The present disclosure relates to clock recovery, and more particularly, to a clock recovery circuit for recovering a clock signal from a clock-embedded data signal, a data receiving device for recovering a clock signal and a data signal from a clock-embedded data signal, and a data transmitting and receiving system for improving the protocol of a clock-embedded data signal.

BACKGROUND ART

Recently, display devices trend toward light weight and low power consumption. In particular, flat panel display devices such as an LCD (liquid crystal display), a PDP (plasma display panel) and an OELD (organic electroluminescence display) are being distributed.

A flat panel display device includes a data receiving device which provides a signal for representing an image, to a display panel. The data receiving device is configured to use a differential signal transmission scheme, such as a mini-LVDS (low voltage differential signaling) scheme and an RSDS (reduced swing differential signaling) scheme, capable of transmitting data at a high speed while reducing electromagnetic interference (EMI), as an interface technology for signal transmission. It is the norm that the differential signal transmission scheme is realized in such a way as to separately receive a clock signal to be used in data recovery and a data signal for representing an image.

However, in the case of the differential signal transmission scheme in which a clock signal and a data signal are separately transmitted, an impedance mismatch may occur in a line for transmitting the clock signal. If reflective waves are generated in the line for transmitting the clock signal due to the impedance mismatch, the data receiving device may be encountered with a problem in that signal distortion and electromagnetic interference increase by the reflective waves.

In order to cope with this problem, a data receiving device may use an interface technology using a signal in which a clock signal is embedded in a data signal. The signal in which a clock signal is embedded in a data signal may be defined as a clock-embedded data signal. In the clock-embedded data signal, dummy data and a clock signal are embedded together between data signals.

In the case of using the clock-embedded data signal, the recovery of a clock signal may be implemented by detecting the state of the clock edge of an embedded clock signal after dummy data.

A conventional data receiving device uses a clock-embedded data signal in which the clock edge of an embedded clock signal is fixed to a rising edge or a falling edge. Therefore, in a device for interfacing a transmission side and a reception side to receive data, it is difficult to prevent electromagnetic interference from increasing at a specified frequency.

Hence, the suggestion of a protocol of a clock-embedded data signal invulnerable to electromagnetic interference and the suggestion of a clock recovery technology capable of recovering a clock signal in correspondence to the changed protocol are demanded in the art.

DISCLOSURE

Technical Problem

Various embodiments are directed to a data transmitting and receiving system with an improved protocol capable of scrambling a clock edge of an embedded clock signal of a clock-embedded data signal to reduce the influence of electromagnetic interference.

Also, various embodiments are directed to a clock recovery circuit capable of recovering a clock signal from a clock-embedded data signal by using a delay-locked loop.

Further, various embodiments are directed to a clock recovery circuit capable of recovering a clock signal from a clock-embedded data signal which includes an embedded clock signal with a scrambled clock edge.

Moreover, various embodiments are directed to a clock recovery circuit and a data receiving device, which receive a clock-embedded data signal including an embedded clock signal with a scrambled clock edge, after a clock of a delay-locked loop is locked, and are capable of recovering a clock signal from the clock-embedded data signal.

Furthermore, various embodiments are directed to a data receiving device capable of recovering a clock signal from a clock-embedded data signal including an embedded clock signal with a scrambled clock edge and capable of recovering a data signal from the clock-embedded data signal by using a sampling clock signal generated in the process of recovering the clock signal.

Technical Solution

In an embodiment, a data transmitting and receiving system may include: a data transmitting device configured to scramble a clock edge of each embedded clock signal to any one of rising and falling, and transmit a clock-embedded data signal in which the embedded clock signal is embedded in a data signal; and a data receiving device configured to recover a clock signal corresponding to the embedded clock signal from the clock-embedded data signal.

In an embodiment, a data receiving device may include: a voltage control delay configured to delay a first or second master clock signal, and generate delayed clock signals which have time differences; a delay control circuit configured to feed back a part of the delayed clock signals, and control a delay time by which the first or second master clock signal is to be delayed in the voltage control delay, in correspondence to a phase difference of the fed-back delayed clock signals; and a clock generator configured to perform recovery of the first master clock signal by using a first clock-embedded data signal before a clock is locked and recovery of the second master clock signal by using a second clock-embedded data signal after the clock is locked, detect a clock edge of an embedded clock signal from the second clock-embedded data signal including the embedded clock signal in which the clock edge is scrambled, perform descramble of recovering the second master clock signal by sequentially performing pulldown and pullup after the detected clock edge, and control the detection of the clock edge, the pulldown and the pullup by using the delayed clock signals.

In an embodiment, a clock recovery circuit may include: a clock-embedded data processing circuit configured to receive a clock-embedded data signal in which a clock edge of an embedded clock signal is scrambled to any one of rising and falling, after a clock is locked, and perform output of an edge detection signal including edge pulses corresponding to edges of clocks of the clock-embedded data signal; a mask circuit configured to generate a mask signal by using delayed clock signals which have time differences as a master clock signal is delayed, and mask the edge detection signal by the mask signal and selectively transfer an edge pulse corresponding to the clock edge of the embedded clock signal; a first inverter configured to invert the edge pulse and output a resultant signal; a second inverter connected to an output terminal of the first inverter; a pulldown circuit configured to fix an input terminal of the first inverter by a first pulldown signal which is enabled after the mask signal is disabled; a pulldown-pullup circuit configured to sequentially perform the pulldown for retaining a drive state of the second inverter, by a second pulldown signal after the second inverter is driven by the edge pulse corresponding to the clock edge of the embedded clock signal and the pullup for changing the drive state of the second inverter by a first pullup signal; and a control signal generator configured to provide the first and second pulldown signals and the first pullup signal by using the delayed clock signals.

Advantageous Effects

According to the embodiments, advantages are provided in that a clock-embedded data signal may be transmitted and received by scrambling a clock edge of an embedded clock signal, and it is possible to reduce the influence of electromagnetic interference by an improved protocol.

Also, according to the embodiments, a clock signal may be recovered from a clock-embedded data signal by using a delay-locked loop, and it is possible to realize a clock edge descrambling function capable of recovering a clock signal in correspondence to an embedded clock signal in which a clock edge has randomness to any one state of a rising edge and a falling edge.

Therefore, a clock signal may be recovered from a clock-embedded data signal including an embedded clock signal with a scrambled clock edge, and a data signal may be recovered by using a sampling clock signal generated in the process of recovering the clock signal.

Accordingly, in the embodiments, since a clock signal may be recovered from a clock-embedded data signal including an embedded clock signal with a scrambled clock edge, it is possible to realize a system with a characteristic invulnerable to electromagnetic interference.

Further, in the embodiments, since a circuit for processing a clock-embedded data signal and recovering a clock signal may be realized by a decreased number of components, high speed operation and reduced power consumption are possible. Moreover, in the embodiments, an improved jitter characteristic may be accomplished.

MODE FOR INVENTION

Hereafter, various examples of embodiments of the present disclosure will be described in detail with reference to the accompanying drawings.

Embodiments of the present disclosure suggest an example of a technology for transmitting and receiving a signal for representing an image on a flat panel display device. A data signal and a clock signal for representing an image may be transmitted and received using a data transmitting and receiving system implemented as shown in FIG. 1.

Figure 1:
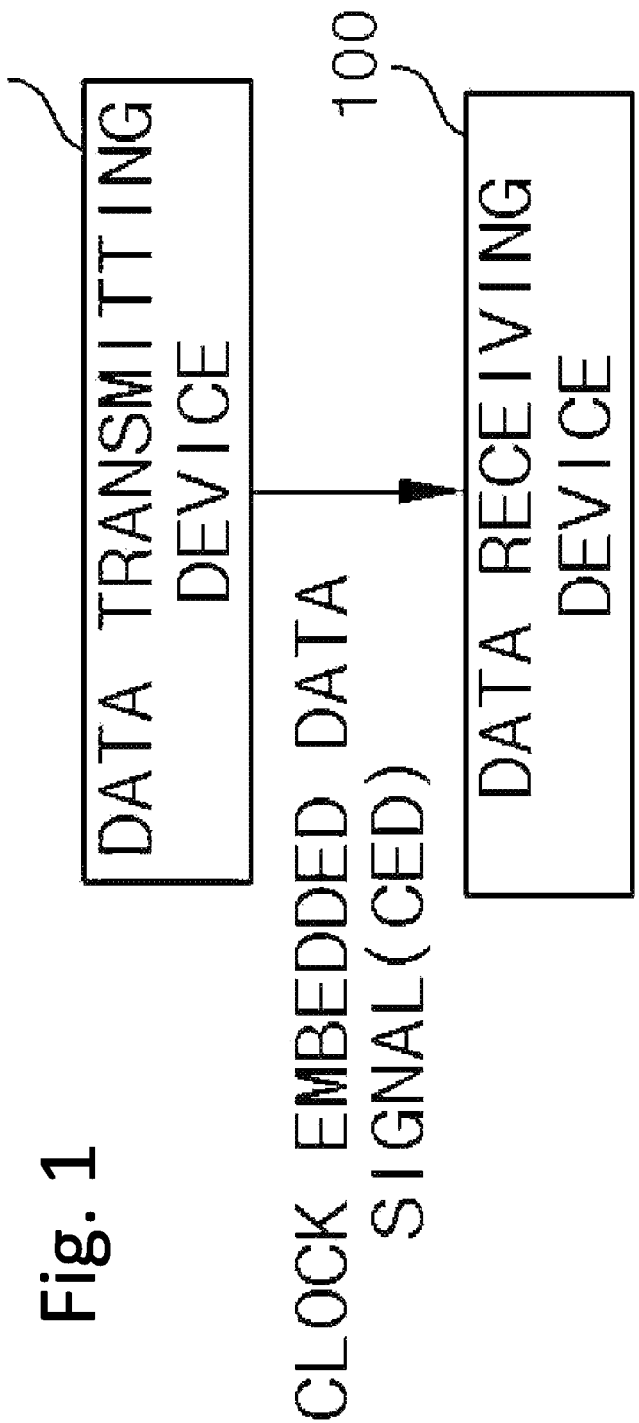
FIG. 1 is a block diagram illustrating an example of a data transmitting and receiving system in accordance with an embodiment.

An embodiment of the data transmitting and receiving system of FIG. 1 includes a data transmitting device 102 for transmitting a signal and a data receiving device 100 for receiving a signal. The data transmitting device 102 may correspond to a data source, such as a timing controller, a computer or the like, which transmits a data signal in a digital transmission scheme, and the data receiving device 100 may correspond to a receiving device which performs a signal processing process for representing the data signal transmitted in the digital transmission scheme, on a flat panel display as an image. In detail, the data receiving device 100 may correspond to a source driver integrated circuit for driving the flat panel display of a flat panel display device such as an LCD, a PDP and an OLED.

Further, the embodiment of the present disclosure may be configured to have a protocol that uses a clock-embedded data signal. That is to say, the data transmitting device 102 transmits a clock-embedded data signal to the data receiving device 100.

Figure 2:
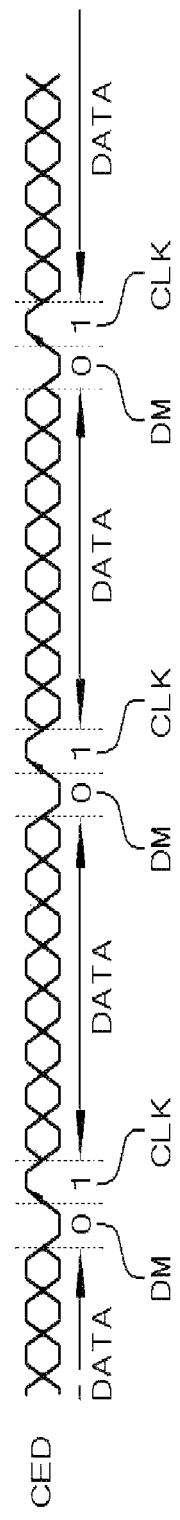
FIG. 2 is a waveform diagram illustrating an example of a clock-embedded data signal in the case where the clock edge of an embedded clock signal is fixed to a rising edge.
Figure 3:
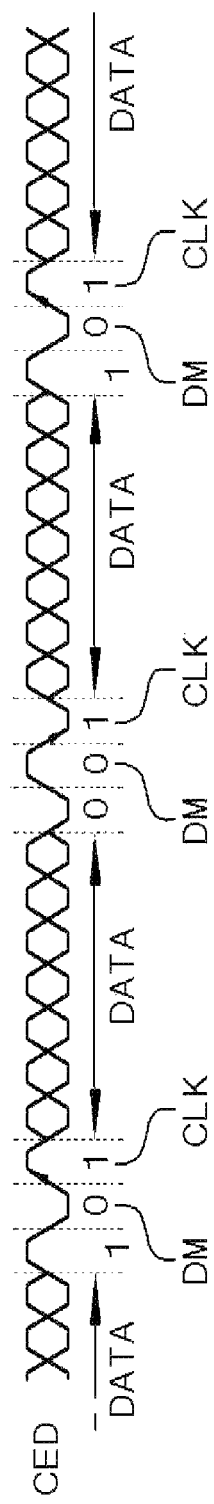
FIG. 3 is a waveform diagram illustrating an example of a clock-embedded data signal in the case where the clock edge of an embedded clock signal is scrambled.

The clock-embedded data signal means a signal in which a clock signal is embedded between data signals, and may have the format as shown in FIG. 2 or FIG. 3.

The clock-embedded data signal is designated by CED in FIGS. 2 and 3. The clock-embedded data signal CED includes a plurality of data Data, and the data Data may be distinguished by dummy data DM. In FIGS. 2 and 3, the dummy data DM is illustrated as a 1-bit signal. A clock signal CLK included in the clock-embedded data signal CED is defined as an embedded clock signal. The dummy data DM and the embedded clock signal CLK are embedded between data signals, and the embedded clock signal CLK is positioned next to the dummy data DM.

FIG. 2 illustrates a clock-embedded data signal CED in which the clock edge of an embedded clock signal CLK is fixed. The clock edge of the embedded clock signal CLK shown in FIG. 2 is illustrated as a rising edge, for example.

In detail, the clock-embedded data signal CED of FIG. 2 is illustrated as the case in which dummy data DM is set to a logic low ("0") and the embedded clock signal CLK is fixed to a logic high ("1").

FIG. 3 illustrates a clock-embedded data signal CED in which the clock edge of an embedded clock signal CLK is not fixed due to scramble.

In detail, the clock-embedded data signal CED of FIG. 3 includes that the clock edge of an embedded clock signal CLK rises according as dummy data DM is set to a logic low ("0") and the clock edge of an embedded clock signal CLK falls according as dummy data DM is set to a logic high ("1"). In other words, each embedded clock signal CLK of the clock-embedded data signal CED shown in FIG. 3 has a random clock edge state corresponding to any one of rising and falling.

The embodiment according to the present disclosure may recover a clock signal in correspondence to the clock-embedded data signals CED of FIGS. 2 and 3. In particular, in the case where the clock-embedded data signal CED of FIG. 3 is used, the data transmitting and receiving system may have a characteristic invulnerable to electromagnetic interference since the clock edge of an embedded clock signal CLK after data may be distributed to rising or falling, and as a result, may precisely recover a clock signal.

In the embodiment of the present disclosure, a clock-embedded data signal CED in which a clock is not locked is initially transmitted to the data receiving device 100. This period is defined as a clock training period, and at this time, it may be assumed that a lock signal (LOCK) which defines the lock state of a clock is set to a logic low, that is, a disabled state. If a clock is stabilized, the data transmitting device 102 transmits a clock-embedded data signal CED in which a clock is locked, to the data receiving device 100. This period is defined as a normal period, and at this time, it may be assumed that the lock signal (LOCK) which defines the lock state of a clock is set to a logic high, that is, an enabled state.

The lock signal (LOCK) may be determined by identifying the state of an embedded clock signal of a clock-embedded data signal, and may be provided from a timing controller which may be configured as a data transmitting device or an external device which provides or identifies a clock signal.

A clock-embedded data signal provided in the clock training period may be defined as a first clock-embedded data signal, and a clock-embedded data signal provided in the normal period may be defined as a second clock-embedded data signal.

The first clock-embedded data signal includes only an embedded clock signal, and at this time, the embedded clock signal is in the state in which it is not locked. The second clock-embedded data signal may include only an embedded clock signal or may include a data signal and an embedded clock signal. In the case where the second clock-embedded data signal includes only an embedded clock signal, the embedded clock signal is in the state in which the normal lock of a clock is retained, unlike the case of the first clock-embedded data signal.

The data receiving device 100 recovers a clock signal by a clock recovery unit 120 disposed therein. A clock signal, which is recovered based on the first clock-embedded data signal by the clock recovery unit 120, is defined as a first master clock signal, and a clock signal, which is recovered based on the second clock-embedded data signal by the clock recovery unit 120, is defined as a second master clock signal.

The data receiving device 100 according to the embodiment of the present disclosure may be configured to perform the recovery of a clock signal by using a delay-locked loop. The delay-locked loop may be realized by the clock recovery unit 120 which is included in the data receiving device 100.

In the clock recovery unit 120, clock signals are generated as a master clock signal is delayed to have different delay times. The signals generated as the first master clock signal is delayed are defined as first delayed clock signals, and the signals generated as the second master clock signal is delayed are defined as second delayed clock signals.

Moreover, the embodiment according to the present disclosure may recover a clock signal and a data signal by using a clock-embedded data signal including an embedded clock signal in which a clock edge is scrambled as in FIG. 3. The embodiment according to the present disclosure has a clock edge descramble function to recover a clock signal.

The embedded clock signal in which a clock edge is scrambled as in FIG. 3 may be included in the second clock-embedded data signal, and the scrambled clock edge means the start time (edge) of the embedded clock signal which has a random state such as rising or falling. The clock edge descramble function may be defined as meaning a function of recovering a clock signal by detecting a clock edge which is scrambled to a random state.

The clock-embedded data signal according to the embodiment of the present disclosure may be transmitted to the data receiving device 100 in a differential signal transmission scheme or a single signal transmission scheme. In order to describe the embodiment according to the present disclosure, it will be illustrated as an example that the data receiving device 100 receives a clock-embedded data signal which is transmitted in the differential signal transmission scheme. In addition, at least one of dummy data DM and an embedded clock signal CLK, which are included in a clock-embedded data signal, may have a single level. In order to describe the embodiment according to the present disclosure, it will be illustrated as an example that a data signal is represented as a differential signal and dummy data DM and an embedded clock signal CLK are represented as single level signals.

In the embodiment according to the present disclosure, in the case where the first clock-embedded data signal and the second clock-embedded data signal are collectively mentioned, they are referred to as a clock-embedded data signal. Also, in the case where the first master clock signal and the second master clock signal are collectively mentioned, they are referred to as a master clock signal, and, in the case where the first delayed clock signals and the second delayed clock signals are collectively mentioned, they are referred to as delayed clock signals.

Figure 4:
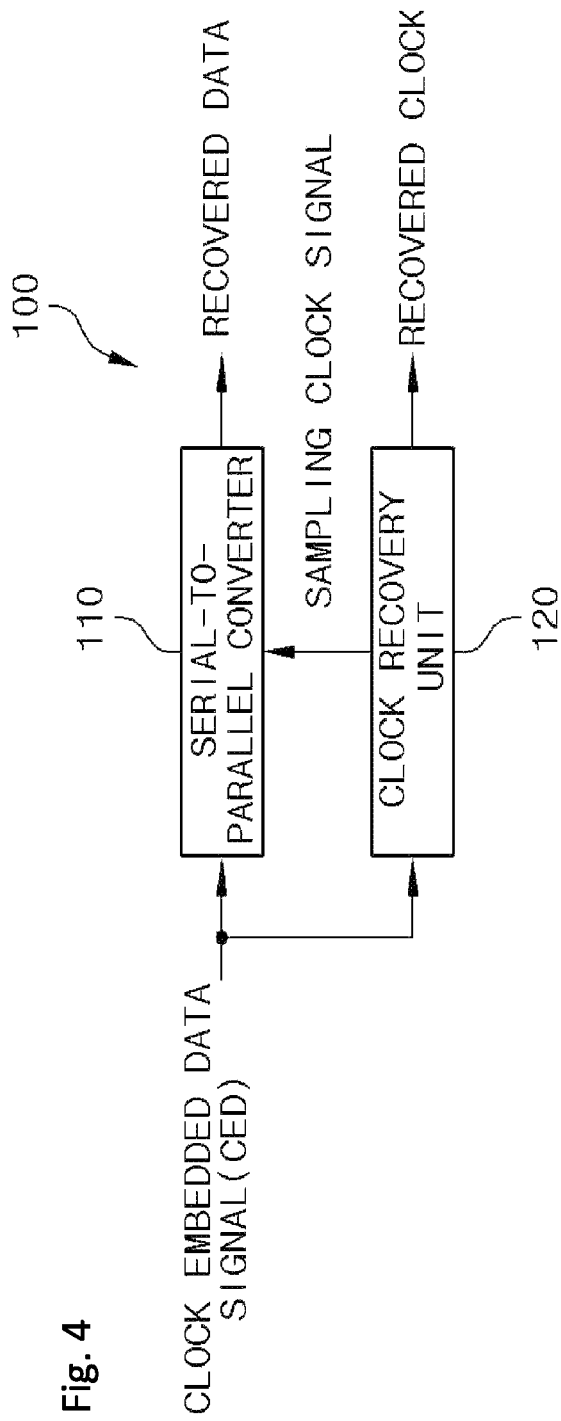
FIG. 4 is a block diagram illustrating a data receiving device in accordance with an embodiment.

FIG. 4 illustrates an embodiment of the data receiving device 100 according to the present disclosure. The data receiving device 100 includes a serial-to-parallel converter 110 and the clock recovery unit 120.

The clock recovery unit 120 recovers a clock signal from a clock-embedded data signal CED. The clock recovery unit 120 generates a sampling clock signal in the process of recovering the clock signal. The sampling clock signal may include one or at least two delayed clock signals which are generated by delaying a recovered clock signal. In the case where at least two delayed clock signals are included in the sampling clock signal, the delay times of the respective delayed clock signals may be different.

The serial-to-parallel converter 110 recovers a data signal from the clock-embedded data signal CED by using the sampling clock signal from the clock recovery unit 120. While it is illustrated in the embodiment according to the present disclosure that the serial-to-parallel converter 110 of FIG. 4 recovers a data signal using a sampling clock signal, the construction of an embodiment in which a data signal is recovered using a recovered clock signal may be envisaged.

Figure 5:
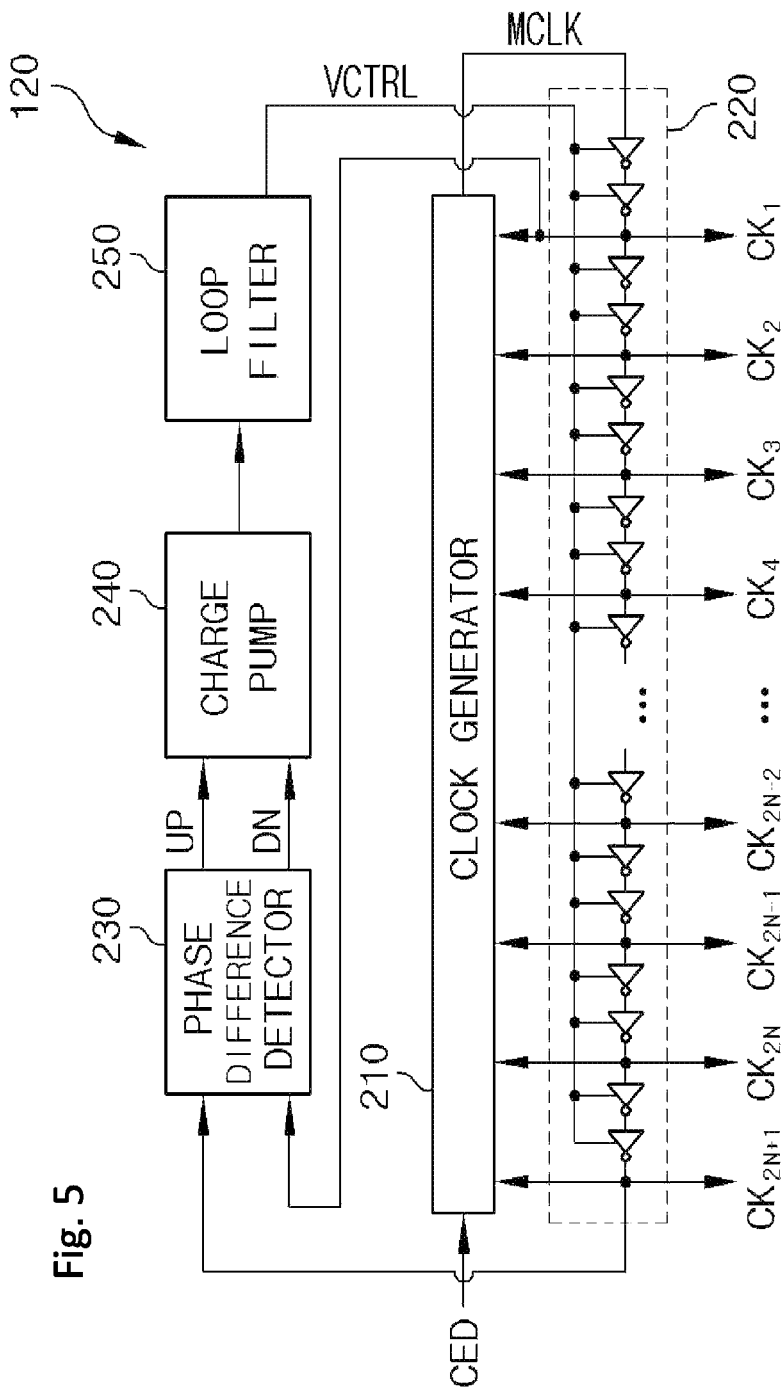
FIG. 5 is a block diagram illustrating an embodiment of the clock recovery unit shown in FIG. 4.

FIG. 5 illustrates an embodiment of the clock recovery unit 120 shown in FIG. 4. The clock recovery unit 120 includes a clock generator 210, a voltage control delay 220, a phase difference detector 230, a charge pump 240, and a loop filter 250.

The clock generator 210 recovers a clock signal from a clock-embedded data signal CED. The clock signal recovered by the clock generator 210 is a master clock signal MCLK. The clock generator 210 is configured to use a plurality of delayed clock signals $CK_1$, $CK_2$, ..., $CK_{2N+1}$ (N is a natural number) which are provided from the voltage control delay 220 and have different delay times, to recover the master clock signal MCLK.

The voltage control delay 220 converts the master clock signal MCLK into the plurality of delayed clock signals $CK_1$, $CK_2$, ..., $CK_{2N+1}$ with different delay times, and outputs the plurality of delayed clock signals $CK_1$, $CK_2$, ..., $CK_{2N+1}$. To this end, the voltage control delay 220 uses a plurality of delay cells which are connected in series, and each delay cell may include a pair of inverters which are connected in series. The respective delayed clock signals $CK_1$, $CK_2$, ..., $CK_{2N+1}$ are the output signals of the delay cells which are connected in series. The respective delayed clock signals $CK_1$, $CK_2$, ..., $CK_{2N+1}$ are signals which have the same phase as the master clock signal MCLK and are sequentially delayed to respectively have a time difference corresponding to the response delay time of two inverters.

The phase difference detector 230, the charge pump 240 and the loop filter 250 configure a delay control circuit for being fed back with delayed clock signals and controlling the response time of the voltage control delay 220 to control a delay time by which the master clock signal MCLK is delayed in the voltage control delay 220.

The phase difference detector 230 detects the phase difference of two delayed clock signals (for example, $CK_1$ and $CK_{2N+1}$) predetermined among the plurality of delayed clock signals $CK_1$, $CK_2$, ..., $CK_{2N+1}$, and selectively activates an up signal UP and a down signal DN in correspondence to the phase difference of the two delayed clock signals. While the two delayed clock signals to be compared in the phase difference detector 230 are illustrated as the delayed clock signals $CK_1$ and $CK_{2N+1}$, it is to be noted that the embodiment of the present disclosure is not limited to such and two random delayed clock signals designed to have the same phase may be compared.

The charge pump 240 generates an output voltage corresponding to the up signal UP or the down signal DN, and the loop filter 250 generates a control voltage VCTRL corresponding to the output voltage of the charge pump 240.

The control voltage VCTRL is used as the driving voltage of the plurality of inverters which are included in the voltage control delay 220. In the case where the control voltage VCTRL is relatively high, an amount of current supplied to the inverters included in the delay cells is increased. Thus, the response delay time of the respective inverters decreases. Conversely, in the case where the control voltage VCTRL is relatively low, an amount of current supplied to the inverters included in the delay cells is decreased. Thus, the response delay time of the respective inverters increases.

By the configuration mentioned above, the clock recovery unit 120 operates as a delay-locked loop and recovers a clock signal.

The clock generator 210 of the clock recovery unit 120 according to the embodiment of the present disclosure may provide the recovered master clock signal MCLK or any one of the plurality of delayed clock signals $CK_1$, $CK_2$, ..., $CK_{2N+1}$ provided from the voltage control delay 220, as a recovered clock signal.

Figure 6:
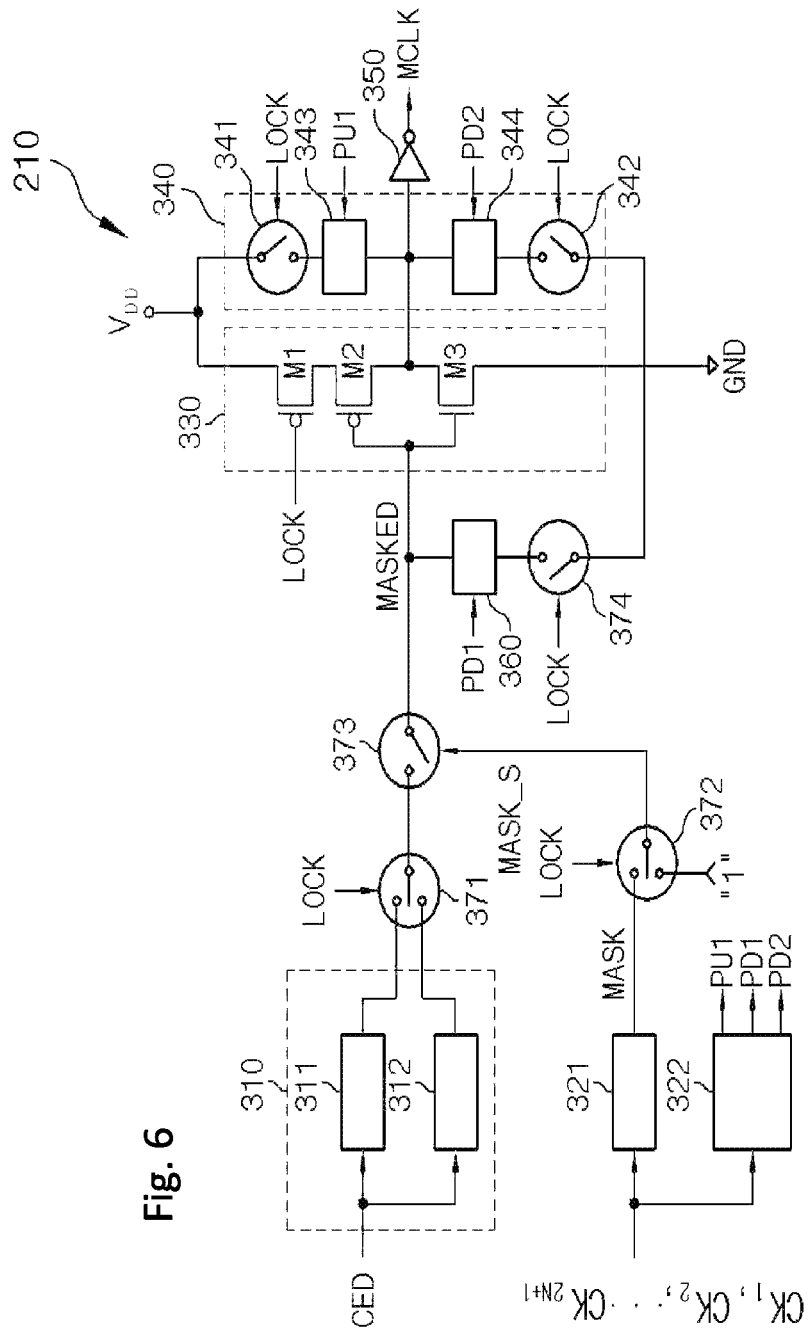
FIG. 6 is a circuit diagram illustrating an embodiment of the clock generator shown in FIG. 5.

FIG. 6 is a circuit diagram illustrating an embodiment of the clock generator 210 according to the present disclosure.

The clock generator 210 buffers a first clock-embedded data signal CED and recovers a first master clock signal MCLK in correspondence to the clock training period. Also, the clock generator 210 recovers a second master clock signal MCLK in correspondence to the normal period, by performing clock edge detection for a second clock-embedded data signal CED, selection of a clock edge corresponding to the clock edge of an embedded clock signal, recovery of a rising edge, and pulldown and pullup for the recovery of a signal period after the rising edge.

The clock generator 210 includes a clock-embedded data processing circuit, a mask circuit, a first inverter 330, a second inverter 350, a pulldown circuit, a pullup-pulldown unit 340, and a control signal generator 322.

The clock-embedded data processing circuit selectively performs the output of a delayed first clock-embedded data signal CED and the output of an edge detection signal EDGE including edge pulses corresponding to the edges of the respective clocks of a second clock-embedded data signal CED, in correspondence to the state of a lock signal LOCK.

To this end, the clock-embedded data processing circuit includes a data signal processing section 310 and a first switch 371. The data signal processing section 310 includes an edge detector 311 and a delay 312. The edge detector 311 generates the edge detection signal EDGE which includes edge pulses toggling in correspondence to the edges of the respective clocks included in a clock-embedded data signal CED, that is, the respective edges of a data signal and an embedded clock signal, and the delay 312 delays and transfers the clock-embedded data signal CED. The delay 312 may be configured to bypass the clock-embedded data signal CED or output a delayed clock-embedded data signal by applying a delay time designed in advance.

The first switch 371 is configured to select one of the outputs of the delay 312 and the edge detector 311 in response to the lock signal LOCK. The first switch 371 may be configured to select and output the delayed clock-embedded data signal CED which is outputted from the delay 312, in response to the lock signal LOCK of a logic low level, and select and output the edge detection signal EDGE which is outputted from the edge detector 311, in response to the lock signal LOCK of a logic high level.

By the above configuration, the clock-embedded data processing circuit provides the delayed clock-embedded data signal CED outputted from the delay 312, to a third switch 373, in the case where the lock signal LOCK is the logic low level, and provides the edge detection signal EDGE outputted from the edge detector 311, to the third switch 373, in the case where the lock signal LOCK is the logic high level.

The mask circuit generates a mask signal MASK by using the plurality of delayed clock signals $CK_1$, $CK_2$, ..., $CK_{2N+1}$, and performs a mask operation for the edge detection signal EDGE, by selecting the mask signal MASK in correspondence to the state of the lock signal LOCK.

To this end, the mask circuit may include a mask signal generator 321 which generates the mask signal MASK using the plurality of delayed clock signals $CK_1$, $CK_2$, ..., $CK_{2N+1}$, a second switch 372 which outputs a signal MASK_S resulted from selecting one of the mask signal MASK and a logic high ("1") signal, in response to the lock signal LOCK, and the third switch 373 which switches the signal transferred from the first switch 371, in response to the signal MASK_S outputted from the second switch 372. The mask signal generator 321 may generate the mask signal MASK using the delayed clock signals $CK_{2N-1}$ and $CK_{2N+1}$.

In the case where the lock signal LOCK is the logic low level, the third switch 373 of the mask circuit is fixed in its turned-on state by the logic high ("1") signal outputted from the second switch 372, and as a result, transfers the clock-embedded data signal CED from the delay 312 which is selected by the first switch 371, to the input terminal of the first inverter 330 as it is. Conversely, in the case where the lock signal LOCK is the logic high level, the third switch 373 of the mask circuit is switched by the mask signal MASK, and as a result, selectively masks the edge detection signal EDGE which is outputted from the edge detector 311.

By the mask signal generator 321, the mask signal MASK may be generated to be enabled from a time when the delayed clock signal $CK_{2N-1}$ transitions to high to a time when the delayed clock signal $CK_{2N+1}$ transitions to high. Namely, the mask signal MASK may be designed to be enabled in correspondence to a period in which the clock edge of an embedded clock signal CLK exists. That is to say, the mask signal MASK is enabled in correspondence to a period corresponding to the clock edge of the embedded clock signal CLK, and the third switch 373 switched by the mask signal MASK may select and pass the edge pulse generated by the clock edge of the embedded clock signal CLK, among the edge pulses of the edge detection signal EDGE.

The first inverter 330 is configured to receive a signal MASKED which is masked by the mask circuit and be controlled in its inverting operation by the lock signal LOCK. In detail, the first inverter 330 is transferred with the first clock-embedded data signal or the edge pulse generated by the clock edge of the embedded clock signal CLK, from the third switch 373, and inverts the phase of the signal MASKED outputted from the third switch 373, in response to the lock signal LOCK.

To this end, the first inverter 330 includes a first MOS transistor M1 having the gate terminal to which the lock signal LOCK is applied, and second and third MOS transistors M2 and M3 having the gate terminals to which the signal MASKED outputted from the third switch 373 is applied. The first MOS transistor M1 is configured such that a power supply voltage $V_{DD}$ is applied to the source and the drain is connected to the source of the second MOS transistor M2. The second MOS transistor M2 is configured such that the drain is connected to the source of the third MOS transistor M3. The third MOS transistor M3 is configured such that a ground voltage GND is applied to the drain. The first MOS transistor M1 and the second MOS transistor M2 may be configured by P type MOS transistors, and the third MOS transistor M3 may be configured by an N type MOS transistor. The commonly connected gates of the second and third MOS transistors M2 and M3 serve as the input terminal of the first inverter 330, and the commonly connected drain and source nodes of the second and third MOS transistors M2 and M3 serve as the output terminal of the first inverter 330.

The second inverter 350 is connected to the output terminal of the first inverter 330, and is configured to invert the output of the first inverter 330.

The pulldown circuit is configured to control the floating of the input terminal of the first inverter 330 in response to the lock signal LOCK and a first pulldown signal PD1.

In detail, the pulldown circuit includes a first pulldown block 360 and a fourth switch 374 which are connected in series, and is configured to control the floating of the input terminal of the first inverter 330 by the lock signal LOCK and the first pulldown signal PD1. The pulldown circuit is connected in parallel to the third switch 373, the first pulldown signal PD1 is applied to the first pulldown block 360, and the fourth switch 374 switches the application of the ground voltage GND to the first pulldown block 360 in correspondence to the lock signal LOCK.

The pullup-pulldown unit 340 is configured to pullup or pulldown the input terminal of the second inverter 350 by the lock signal LOCK, a first pullup signal PU1 and a second pulldown signal PD2.

To this end, the pullup-pulldown unit 340 includes a fifth switch 341, a sixth switch 342, a first pullup block 343, and a second pulldown block 344. The fifth switch 341 switches the transfer of the power supply voltage $V_{DD}$ to the first pullup block 343, in response to the lock signal LOCK, the sixth switch 342 switches the transfer of the ground voltage GND to the second pulldown block 344, in response to the lock signal LOCK, the first pullup block 343 is disposed between the fifth switch 341 and the input terminal of the second inverter 350 and raises the voltage of the input terminal of the second inverter 350 in response to the first pullup signal PU1, and the second pulldown block 344 is disposed between the sixth switch 342 and the input terminal of the second inverter 350 and lowers the voltage of the input terminal of the second inverter 350 in response to the second pulldown signal PD2.

The control signal generator 322 is configured to provide the first and second pulldown signals PD1 and PD2 and the first pullup signal PU1 by using the plurality of delayed clock signals $CK_1$, $CK_2$, ..., $CK_{2N+1}$. As an embodiment, the first and second pulldown signals PD1 and PD2 may be applied from the same signal, and may be generated using the delayed clock signals $CK_{2N+1}$ and $CK_N$. The first pullup signal PU1 may be generated using the delayed clock signals $CK_N$ and $CK_{2N-1}$. While it is assumed that the first and second pulldown signals PD1 and PD2 have the same phase and magnitude, it is to be noted that an embodiment, in which the phases and magnitudes of the first and second pulldown signals PD1 and PD2 are set differently, is possible.

When the lock signal LOCK is the logic low state, the first switch 371 is switched to select the delayed clock-embedded data signal CED which is outputted from the delay 312, the second switch 372 is switched to select the logic high ("1"), and the fourth switch 374, the fifth switch 341 and the sixth switch 342 are opened.

Conversely, when the lock signal LOCK is the logic high state, the first switch 371 is switched to select the edge detection signal EDGE which is outputted from the edge detector 311, the second switch 372 is switched to select the mask signal MASK which is outputted from the mask signal generator 321, and the fourth switch 374, the fifth switch 341 and the sixth switch 342 are shorted. Here, being opened means that switches are turned off, and being shorted means that switches are turned on.

First, with reference to FIGS. 7 and 8, operations of the embodiment in correspondence to the state in which the clock of the delay-locked loop is not locked, that is, the clock training period, will be described. The lock signal LOCK is the logic low state. The thick solid lines in FIG. 7 mean paths in which signal transfer is activated.

In the case of the clock training period corresponding to the lock signal LOCK of the logic low state, a clock-embedded data signal CED only including an embedded clock signal is transmitted. At this time, the clock-embedded data signal CED corresponds to the first clock-embedded data signal.

In correspondence to the lock signal LOCK of the logic low state, the first switch 371 selects a delayed first clock-embedded data signal which is outputted from the delay 312, and the second switch 372 transfers the logic high ("1") signal to the third switch 373. The third switch 373 retains a turned-on state by the logic high ("1") signal provided from the second switch 372, and transfers the signal outputted from the first switch 371, to the first inverter 330.

Therefore, the first clock-embedded data signal CED is transferred through the delay 312, the first switch 371, the third switch 373, the first inverter 330 and the second inverter 350, and as a result, a first master clock signal MCLK is recovered.

The fourth switch 374, the fifth switch 341 and the sixth switch 342 are in the state in which they are turned off by the lock signal LOCK of the logic low state. Thus, the power supply voltage $V_{DD}$ and the ground voltage GND do not exert any influence on the recovery of the first master clock signal MCLK.

Figure 7:
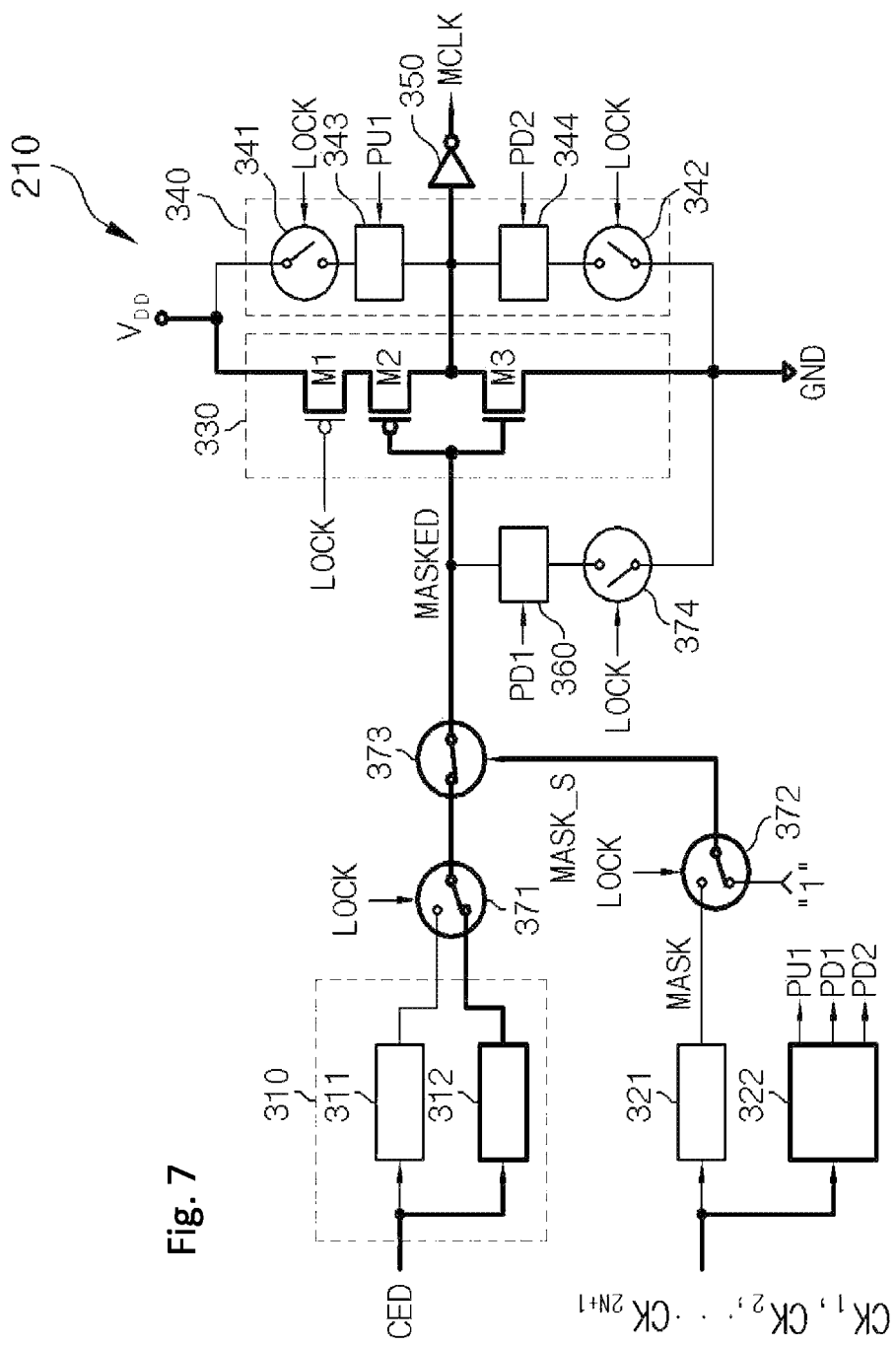
FIG. 7 is a circuit diagram explaining the generation of a first master clock signal during a clock training period in which a lock signal is a logic low state.

In other words, as shown in FIG. 7, the first clock-embedded data signal CED is outputted as the first master clock signal MCLK through the two first and second inverters 330 and 350 which are connected in series, and as a result, the first master clock signal MCLK and the first clock-embedded data signal CED have the same phase.

Figure 8:
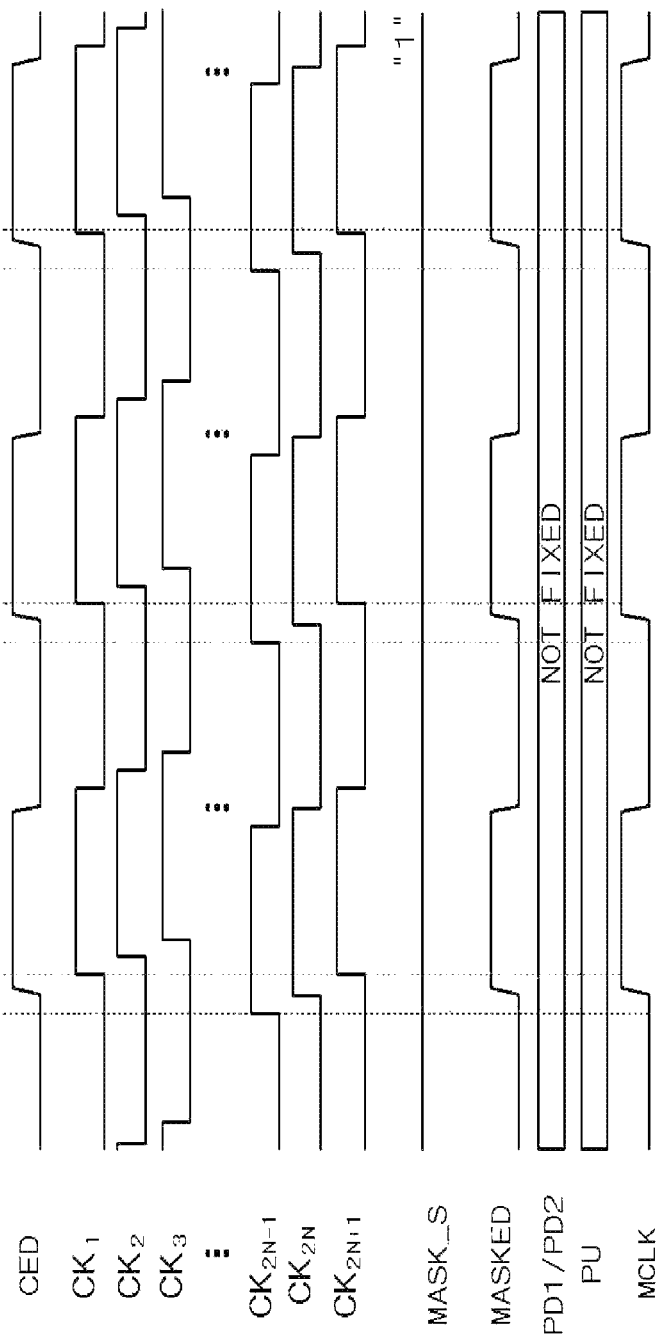
FIG. 8 is a waveform diagram explaining operations in FIG. 7.

The plurality of delayed clock signals $CK_1$, $CK_2$, . . . , $CK_{2N+1}$ of FIG. 8 are signals which are generated by delaying the recovered first master clock signal MCLK by the unit of a predetermined time through using the voltage control delay 220, and correspond to first delayed clock signals. Referring to FIG. 8, it may be seen that 2N number of delayed clock signals are generated during one cycle of the master clock signal MCLK. N is a natural number. Before the first master clock signal MCLK is recovered, the pulldown and pullup signals PD and PU may be set to a deactivated state NOT FIXED.

If the clock training period described above with reference to FIGS. 7 and 8 is ended, the normal period is started.

In the normal period, the lock signal LOCK is converted into the logic high state. Namely, the clock of the delay-locked loop retains a locked state. A clock-embedded data signal CED may include both an embedded clock signal and a data signal or may include only a clock signal. The clock-embedded data signal CED in the normal period corresponds to the second clock-embedded data signal.

For reference, immediately after the clock training period is ended, the second master clock signal MCLK may be recovered using the mask signal MASK generated by the first delayed clock signals, the first and second pulldown signals PD1 and PD2, and the first pullup signal PU1.

The second master clock signal MCLK of a next cycle may be recovered using the mask signal MASK generated by the second delayed clock signals, the first and second pulldown signals PD1 and PD2, and the first pullup signal PU1. The second delayed clock signals correspond to the plurality of delayed clock signals $CK_1$, $CK_2$, . . . , $CK_{2N+1}$ described below with reference to FIGS. 9 to 12.

Operations for generating the second master clock signal MCLK in the normal period in which the lock signal LOCK is the logic high state will be described below with reference to FIGS. 9 to 12.

Figure 9:
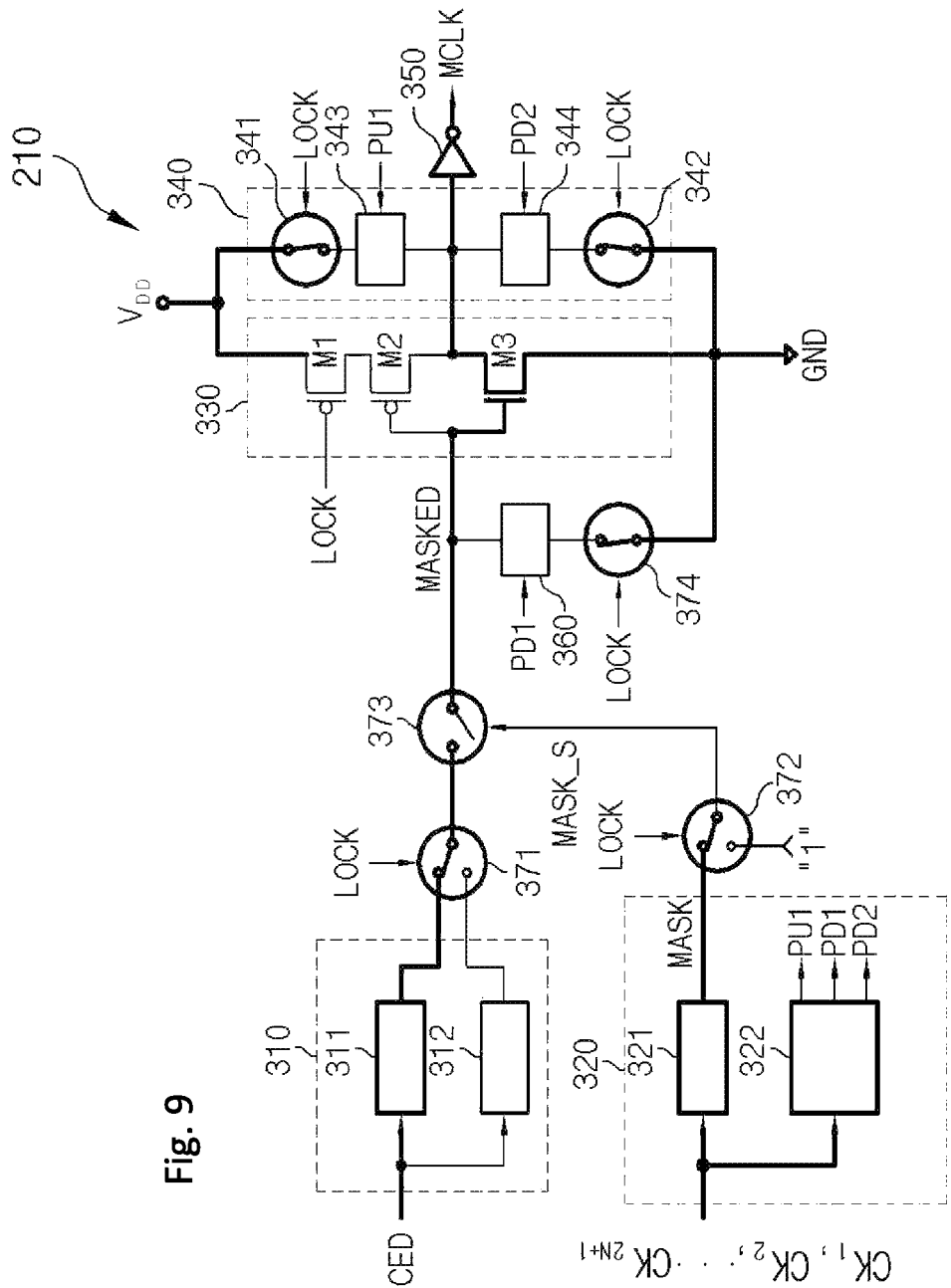
FIG. 9 is a circuit diagram explaining an operation of recovering the rising edge of a second master clock signal during a normal period in which the lock signal is a logic high state.
Figure 10:
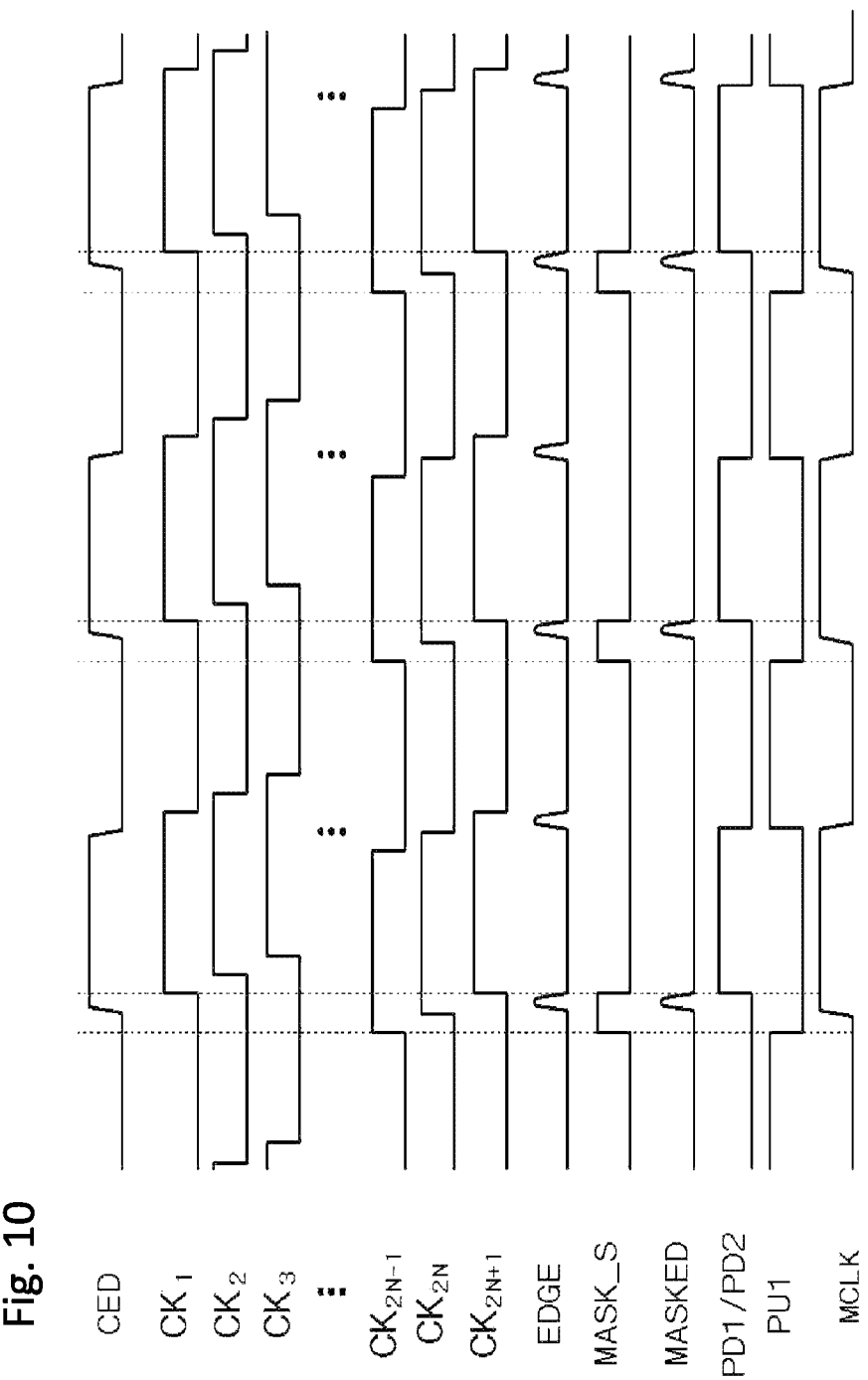
FIG. 10 is a waveform diagram illustrating the signals used in the clock generator shown in FIG. 9.
Figure 11:
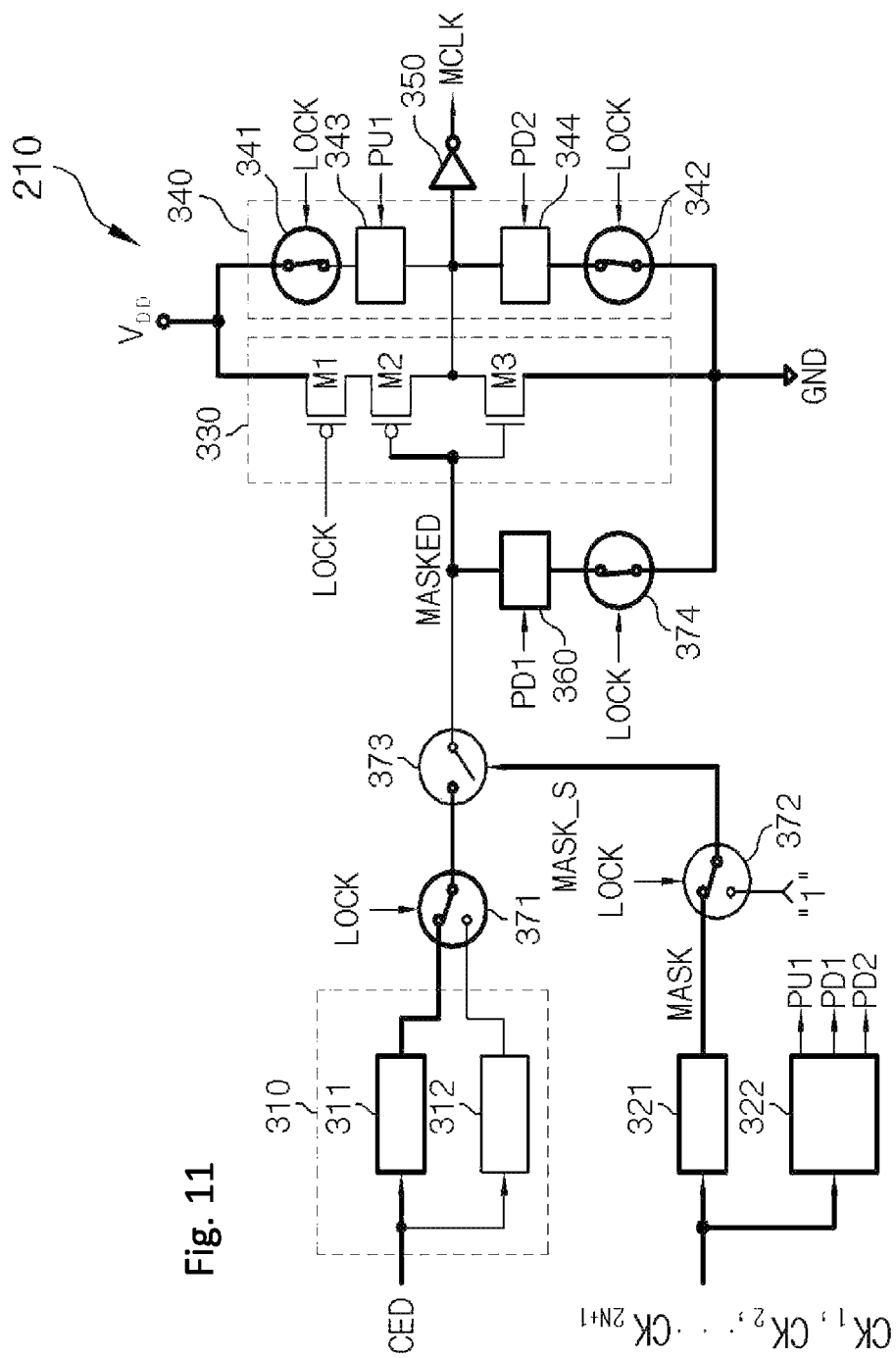
FIG. 11 is a circuit diagram explaining a pulldown operation for recovering the second master clock signal during the normal period in which the lock signal is the logic high state.
Figure 12:
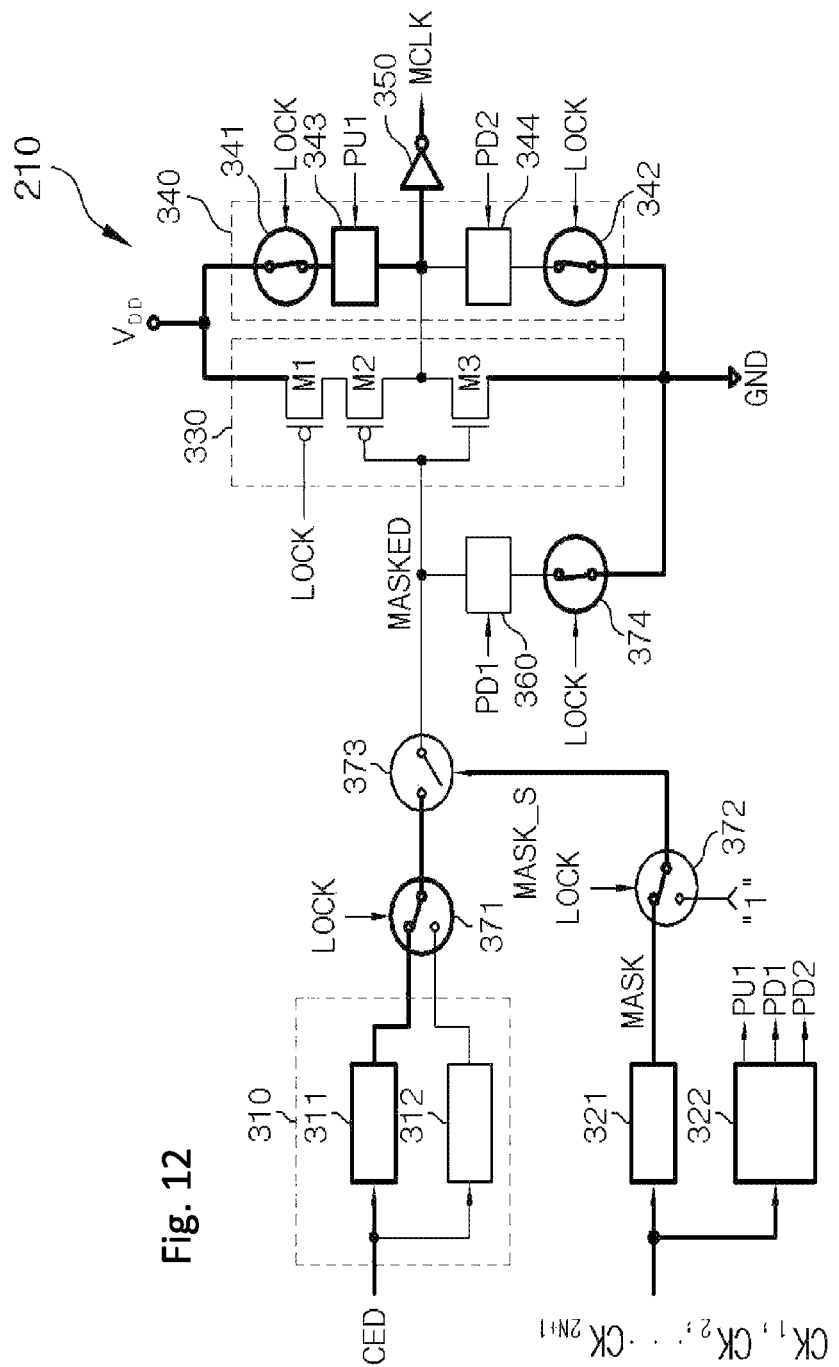
FIG. 12 is a circuit diagram explaining a pullup operation for recovering the second master clock signal during the normal period in which the lock signal is the logic high state.

FIG. 9 is a circuit diagram for clock edge detection for a clock-embedded data signal CED, selection of a clock edge corresponding to the scrambled clock edge of an embedded clock signal CLK, and the recovery of the rising edge of a second master clock signal MCLK to be recovered. FIG. 11 is a circuit diagram for explaining the operations of the clock generator 210 which performs pulldown to recover a pullup period after the rising edge of the second master clock signal MCLK, and FIG. 12 is a circuit diagram for explaining a pullup operation for the recovery of the second master clock signal MCLK. FIG. 10 is a waveform diagram to assist in the explanations of the operations of FIGS. 9, 11 and 12.

FIGS. 9 to 12 are to explain the operations of the embodiment for recovering a second master clock signal MCLK in correspondence to a second clock-embedded data signal CED including only an embedded clock signal. The thick solid lines in FIGS. 9, 11 and 12 mean paths in which signal transfer is activated.

First, with reference to FIGS. 9 and 10, the operations of detecting the scrambled clock edge of the embedded clock signal CLK of the second clock-embedded data signal CED and recovering the rising edge of the second master clock signal MCLK will be described below.

In correspondence to the lock signal LOCK of the logic high state, the first switch 371 selects the edge detection signal EDGE which is outputted from the edge detector 311, and the second switch 372 transfers the mask signal MASK which is outputted from the mask signal generator 321, to the third switch 373. The third switch 373 switches the transfer of the signal outputted from the first switch 371, to the first inverter 330, by the signal MASK_S outputted from the second switch 372. The signal MASK_S transferred from the second switch 372 to the third switch 373 is the same as the mask signal MASK which is outputted from the mask signal generator 321.

As described above, the mask signal MASK is enabled from a time when the delayed clock signal $CK_{2N-1}$ transitions to high to a time when the delayed clock signal $CK_{2N+1}$ transitions to high. That is to say, the mask signal MASK is set to be enabled in correspondence to a period for detecting the scrambled clock edge of the embedded clock signal CLK included in the second clock-embedded data signal CED.

The edge detector 311 generates the edge detection signal EDGE including edge pulses which toggle in correspondence to the edges of the respective clocks included in the clock-embedded data signal CED, that is, the respective edges of the data signal and the embedded clock signal.

Therefore, the third switch 373 transfers only the edge pulse corresponding to the period in which the mask signal MASK is activated, that is, the scrambled clock edge of the embedded clock signal CLK, to the first inverter 330, among the toggling edge pulses of the edge detection signal EDGE, and masks the remaining edge pulses of the edge detection signal EDGE.

Since the lock signal LOCK is the logic high state, the first MOS transistor M1 of the first inverter 330 is turned off. Thus, the driving of the first inverter 330 by the power supply voltage $V_{DD}$ is blocked.

The third MOS transistor M3 of the first inverter 330 is turned on by the edge pulse of the edge detection signal EDGE in the period in which the mask signal MASK is activated. The first inverter 330 outputs a signal of the level of the ground voltage GND in correspondence to the turn-on of the third MOS transistor M3, and the second inverter 350 inverts the output of the first inverter 330 and outputs a signal of a logic high level.

Since the first and second pulldown blocks 360 and 344 and the first pullup block 343 are in deactivated states by the first and second pulldown signals PD1 and PD2 and the first pullup signal PU1, the second inverter 350 outputs the output of the first inverter 330 through inversion, without being influenced by the operations of the first and second pulldown blocks 360 and 344 and the first pullup block 343.

In the embodiment according to the present disclosure, the rising edge of the second master clock signal MCLK is recovered by detecting only an edge pulse corresponding to the position of the scrambled clock edge of the embedded clock signal without detecting whether the scrambled clock edge of the embedded clock signal is a rising edge or a falling edge. As a consequence, in the embodiment according to the present disclosure, the rising edge of the second master clock signal MCLK may be recovered irrespective of the scrambled state of the clock edge of the embedded clock signal.

Thereafter, in the embodiment according to the present disclosure, pulldown for the recovery of the second master clock signal is performed by the operations of FIGS. 10 and 11.

In other words, after the operations of FIG. 9, the lock signal LOCK retains the logic high state, and the mask signal MASK is deactivated. Therefore, the third switch 373 is turned off. At the time when the mask signal MASK is deactivated, the first and second pulldown signals PD1 and PD2 provided to the first and second pulldown blocks 360 and 344 are activated. The first pullup signal PU1 provided to the first pullup block 343 retains the deactivated state.

The input terminal of the first inverter 330 is fixed to a low level in correspondence to the activation of the lock signal LOCK and the first pulldown signal PD1. Namely, the input terminal of the first inverter 330 may be prevented from being floated due to the turn-off of the third switch 373, by the first pulldown signal PD1. As a result, the third MOS transistor M3 reliably retains the turned-off state since the gate thereof is fixed to a low level by the pulldown operation of the first pulldown block 360.

The input terminal of the second inverter 350 is also fixed to a low level in correspondence to the activation of the lock signal LOCK and the second pulldown signal PD2. Thus, the output terminal of the second inverter 350 is fixed to a high level state.

Consequently, the second master clock signal MCLK may retain the high level after the rising edge thereof is recovered by the above-described pulldown operation. The second master clock signal MCLK may retain the high level until the first pullup signal PU1 is activated. The high level state of the second master clock signal MCLK may be set to be retained for a time corresponding to approximately one half of the cycle of the embedded clock signal CLK of the clock-embedded data signal, as shown in FIG. 10.

The high level of the second master clock signal MCLK may be recovered through the pulldown operation by the operations of FIG. 11, and thereafter, pullup for the recovery of the second master clock signal MCLK is performed by the operations of FIG. 12.

After the operations of FIG. 11, the lock signal LOCK retains the logic high state, and the mask signal MASK retains the deactivated state. Therefore, the third switch 373 is turned off. At the time when the first and second pulldown signals PD1 and PD2 provided to the first and second pulldown blocks 360 and 344 are deactivated, the first pullup signal PU1 provided to the first pullup block 343 is activated.

In correspondence to the deactivation of the first pulldown signal PD1 and the second pulldown signal PD2, the pulldown of the input terminal of the first inverter 330 and the input terminal of the second inverter 350 is interrupted.

In correspondence to the activation of the lock signal LOCK and the first pullup signal PU1, the input terminal of the second inverter 350 is fixed to a high level. Therefore, the output terminal of the second inverter 350 is fixed to a low level. As a result, the second master clock signal MCLK transitions to a low level by the pullup operation. The second master clock signal MCLK retains the low level until a rising clock is recovered in a next cycle.

Meanwhile, a protocol having a scheme for transmitting a clock-embedded data signal CED may be divided into a clock training period, a configuration period, and a data period. The configuration period and the data period correspond to the normal period described above.

The first master clock signal MCLK is recovered in the clock training period, the second master clock signal MCLK is recovered and a general control signal is transmitted in the configuration period, and the second master clock signal MCLK is recovered and actual data to be processed is transmitted in the data period.

Figure 13:
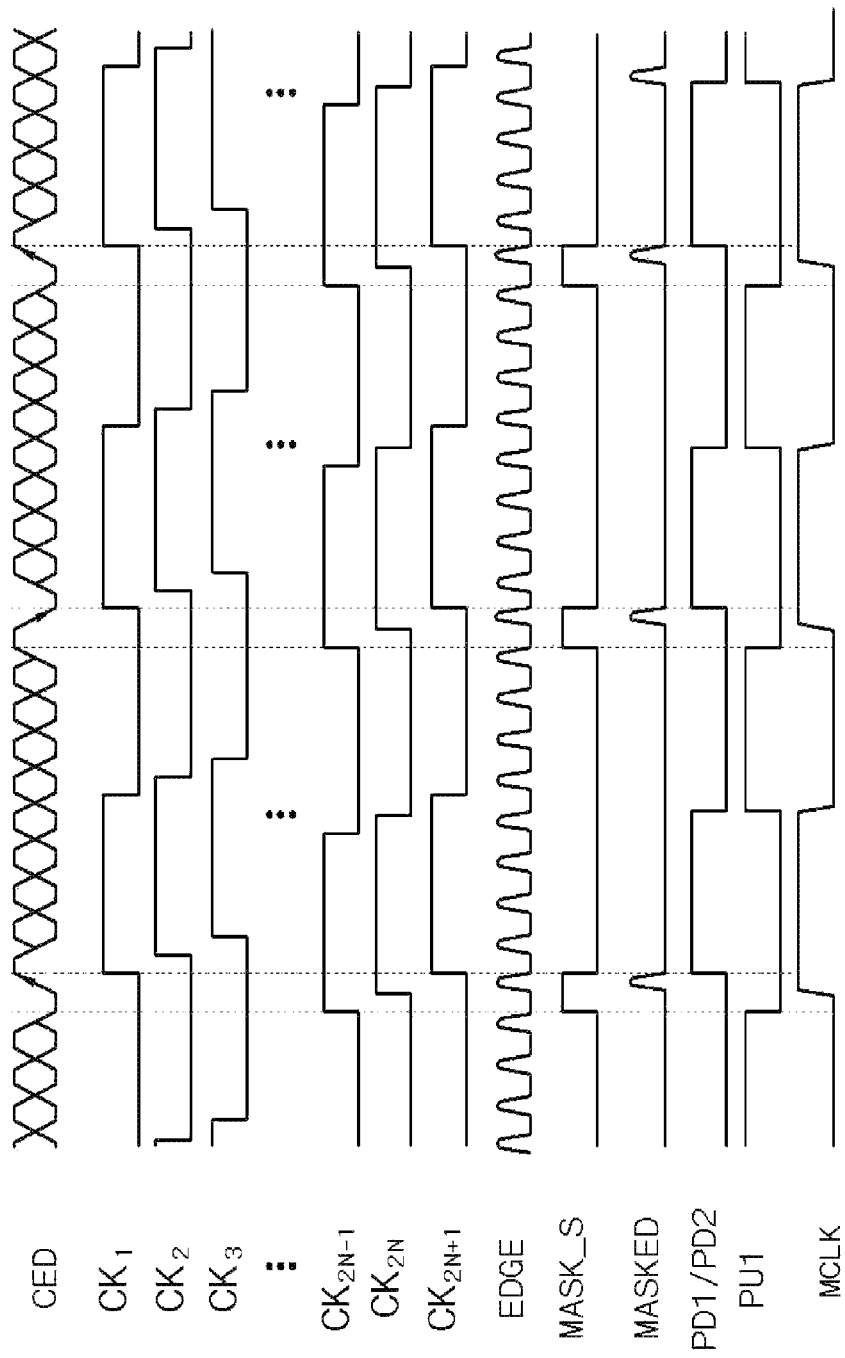
FIG. 13 is a waveform diagram explaining the recovery of the second master clock signal in correspondence to a second clock-embedded data signal including a clock signal and a data signal during the normal period in which the lock signal is the logic high state.

In the configuration period and the data period that correspond to the normal period, the second master clock signal MCLK may be recovered as shown in FIG. 13.

FIG. 13 illustrates the recovery of a second master clock signal MCLK in a data period, and the second master clock signal MCLK may be recovered even in a configuration period as shown in FIG. 13.

When compared to FIG. 10, FIG. 13 is different in that a data signal is included in a second clock-embedded data signal CED and an edge detection signal EDGE includes edge pulses corresponding to the data signal.

The edge pulses of the edge detection signal EDGE which correspond to the data signal of FIG. 13 are masked from being transferred to the first inverter 330, by the mask signal MASK. As a result, the recovery of the second master clock signal MCLK in the data period of FIG. 13 is the same as in FIG. 10, and therefore, repeated descriptions will be omitted.

As is apparent from the above descriptions, in the embodiments of the present disclosure, the rising edge of the second master clock signal MCLK is recovered by detecting an edge pulse corresponding to the position of the scrambled clock edge of the embedded clock signal without detecting whether the scrambled clock edge of the embedded clock signal is a rising edge or a falling edge. Therefore, in the embodiments of the present disclosure, the second master clock signal MCLK may be recovered using not only the clock-embedded data signal not scrambled as in FIG. 2 but also the clock-embedded data signal in which the clock edge of the embedded clock signal is scrambled as in FIG. 3.

As a consequence, in the embodiments of the present disclosure, by distributing the state of the clock edge of the embedded clock signal after dummy data to rising or falling as in FIG. 3, a clock signal may be precisely recovered even in a protocol that minimizes electromagnetic interference.

While various embodiments have been described above, it will be understood to those skilled in the art that the embodiments described are by way of example only. Accordingly, the disclosure described herein should not be limited based on the described embodiments.

The invention claimed is:

1. A data receiving device comprising:
a voltage control delay configured to delay a first or second master clock signal, and generate delayed clock signals which have time differences;
a delay control circuit configured to feed back a part of the delayed clock signals, and control a delay time by which the first or second master clock signal is to be delayed in the voltage control delay, in correspondence to a phase difference of the fed-back delayed clock signals; and
a clock generator configured to perform recovery of the first master clock signal by using a first clock-embedded data signal before a clock is locked and recovery of the second master clock signal by using a second clock-embedded data signal after the clock is locked, detect a clock edge of an embedded clock signal from the second clock-embedded data signal including the embedded clock signal in which the clock edge is scrambled, perform descramble of recovering the second master clock signal by sequentially performing pulldown and pullup after the detected clock edge, and control the detection of the clock edge, the pulldown and the pullup by using the delayed clock signals.

2. The data receiving device according to claim 1, wherein the clock generator receives the second clock-embedded data signal in which the clock edge of the embedded clock signal is scrambled to any one of rising and falling.

3. The data receiving device according to claim 1, wherein the clock generator recovers the first master clock signal by buffering the first clock-embedded data signal.

4. The data receiving device according to claim 1, wherein the clock generator comprises:
   a clock-embedded data processing circuit configured to selectively perform output of a delayed first clock-embedded data signal and output of an edge detection signal which includes edge pulses corresponding to edges of clocks of the second clock-embedded data signal, according to whether the clock is locked or not;
   a mask circuit configured to generate a mask signal using the delayed clock signals, and selectively transfer an edge pulse corresponding to the clock edge of the embedded clock signal through masking the edge detection signal by the mask signal in a state in which the clock is locked;
   a first inverter configured to invert the first clock-embedded data signal or the edge pulse transferred via the mask circuit, and output an inverted signal;
   a second inverter connected to an output terminal of the first inverter;
   a pulldown circuit configured to fix an input terminal of the first inverter by a first pulldown signal which is enabled after the mask signal is disabled in the state in which the clock is locked;
   a pulldown-pullup circuit configured to sequentially perform the pulldown for retaining a drive state of the second inverter, by a second pulldown signal after the second inverter is driven by the edge pulse corresponding to the clock edge of the embedded clock signal and the pullup for changing the drive state of the second inverter by a first pullup signal, in the state in which the clock is locked; and
   a control signal generator configured to provide the first and second pulldown signals and the first pullup signal by using the delayed clock signals.

5. The data receiving device according to claim 4, wherein the data processing circuit comprises:
   a delay configured to delay the first clock-embedded data signal and output the delayed first clock-embedded data signal;
   an edge detector configured to output the edge detection signal which includes the edge pulses corresponding to the edges of the clocks of the second clock-embedded data signal; and
   a first switch configured to transfer an output of any one of the delay and the edge detector by performing switching according to whether the clock is locked or not.

6. The data receiving device according to claim 4, wherein the mask circuit comprises:
   a mask signal generator configured to generate the mask signal using the delayed clock signals;
   a second switch configured to select and output any one of the mask signal and a logic signal with a fixed value according to whether the clock is locked or not; and
   a third switch configured to bypass and transfer to the first inverter a signal provided from the clock-embedded data processing circuit in the case where the logic signal with the fixed value is provided from the second switch, and mask the edge detection signal by the mask signal and selectively transfer the edge pulse corresponding to the clock edge of the embedded clock signal in the case where the mask signal is provided from the second switch.

7. The data receiving device according to claim 4, wherein the control signal generator provides the first and second pulldown signals to have the same phase.

8. The data receiving device according to claim 4, wherein the control signal generator provides the second pulldown signal and the first pullup signal such that a disable time of the second pulldown signal and an enable time of the first pullup signal are the same.

9. The data receiving device according to claim 4, wherein the control signal generator provides the second pulldown signal and the first pullup signal such that a disable time of the second pulldown signal and an enable time of the first pullup signal correspond to one half of a cycle of the embedded clock signal.

* * * * *